United States Patent [19]
Banu et al.

[11] Patent Number: 5,237,290
[45] Date of Patent: Aug. 17, 1993

[54] METHOD AND APPARATUS FOR CLOCK RECOVERY

[75] Inventors: Mihai Banu; Alfred E. Dunlop, both of Murray Hill, N.J.

[73] Assignee: AT&T Bell Laboratories, Murray Hill, N.J.

[21] Appl. No.: 880,428

[22] Filed: May 8, 1992

[51] Int. Cl.$^5$ .................... H03L 7/06; H04L 7/033
[52] U.S. Cl. ........................... 331/2; 307/269; 331/49; 331/55; 331/56; 375/110; 375/120
[58] Field of Search .................. 331/46, 49, 55, 56, 331/2; 375/106, 110, 119, 120; 307/243, 269

[56] References Cited

U.S. PATENT DOCUMENTS

| | | | |
|---|---|---|---|
| 3,893,042 | 7/1975 | Whitman et al. | 331/55 |
| 4,567,448 | 1/1986 | Ikeda | 331/25 |
| 4,891,598 | 1/1990 | Yoshida et al. | 307/269 X |
| 5,134,637 | 7/1992 | Beyer et al. | 307/269 X |

OTHER PUBLICATIONS

Dorros, et al., *The Bell System Technical Journal*, "An Experimental 224 Mb/s Digital Repeatered Line", vol. XLV, No. 7, Sep. 1966, pp. 993-1043.

Cordell, et al., *IEEE Journal of Solid-State Circuits*, "A 50 MHz Phase-and Frequency-Locked Loop", vol. SC 14, No. 6, pp. 1003-1010, Dec. 1979.

*Primary Examiner*—Siegfried H. Grimm
*Attorney, Agent, or Firm*—Jason Paul DeMont

[57] ABSTRACT

A method and apparatus for recovering the phase of a signal which may change at periodic intervals is disclosed which comprises gated variable frequency oscillators. These results are obtained in an illustrative embodiment of the present invention in which an incoming signal is fed into a gated oscillator and the complement of the incoming signal is fed into a matching gated oscillator. Advantageously, the respective outputs of the two oscillators are fed into a Boolean NOR gate. When the gated oscillators are designed to oscillate at the frequency of the incoming signal, the output waveform will have a bounded phase relationship with respect to the incoming signal.

10 Claims, 14 Drawing Sheets

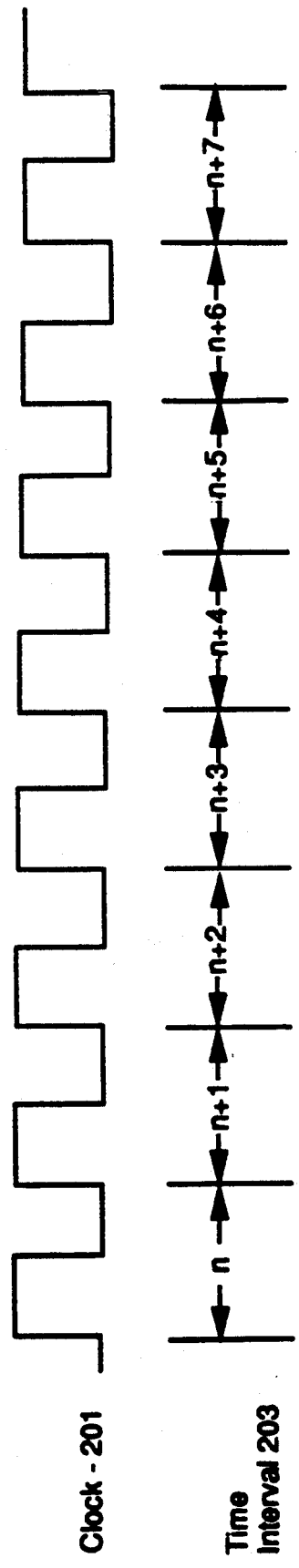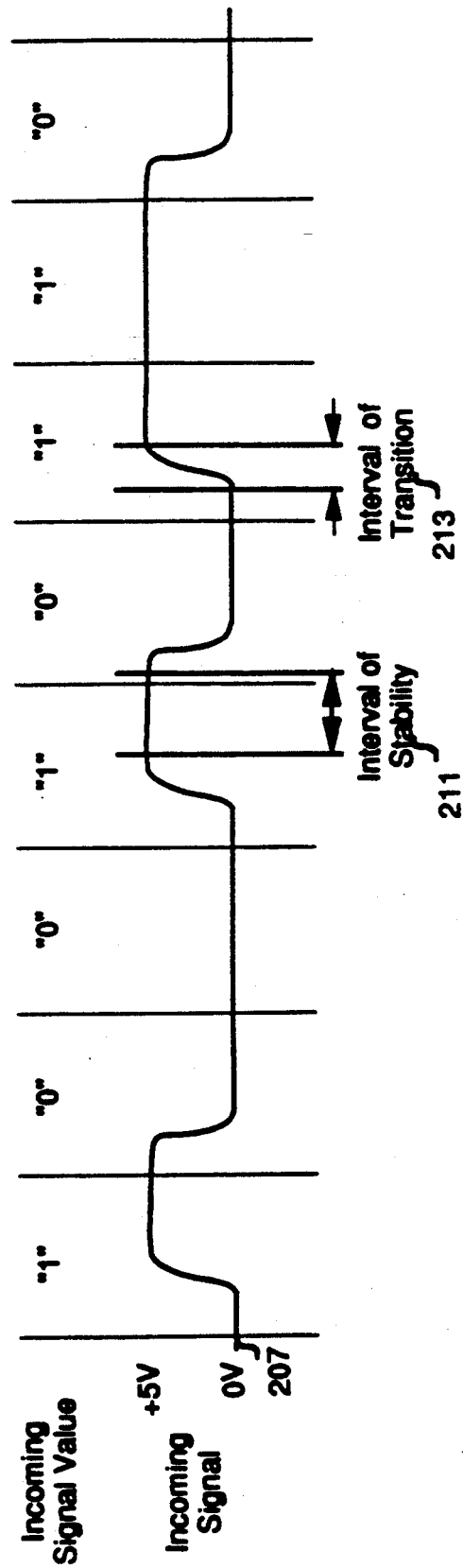
FIG. 2
(PRIOR ART)

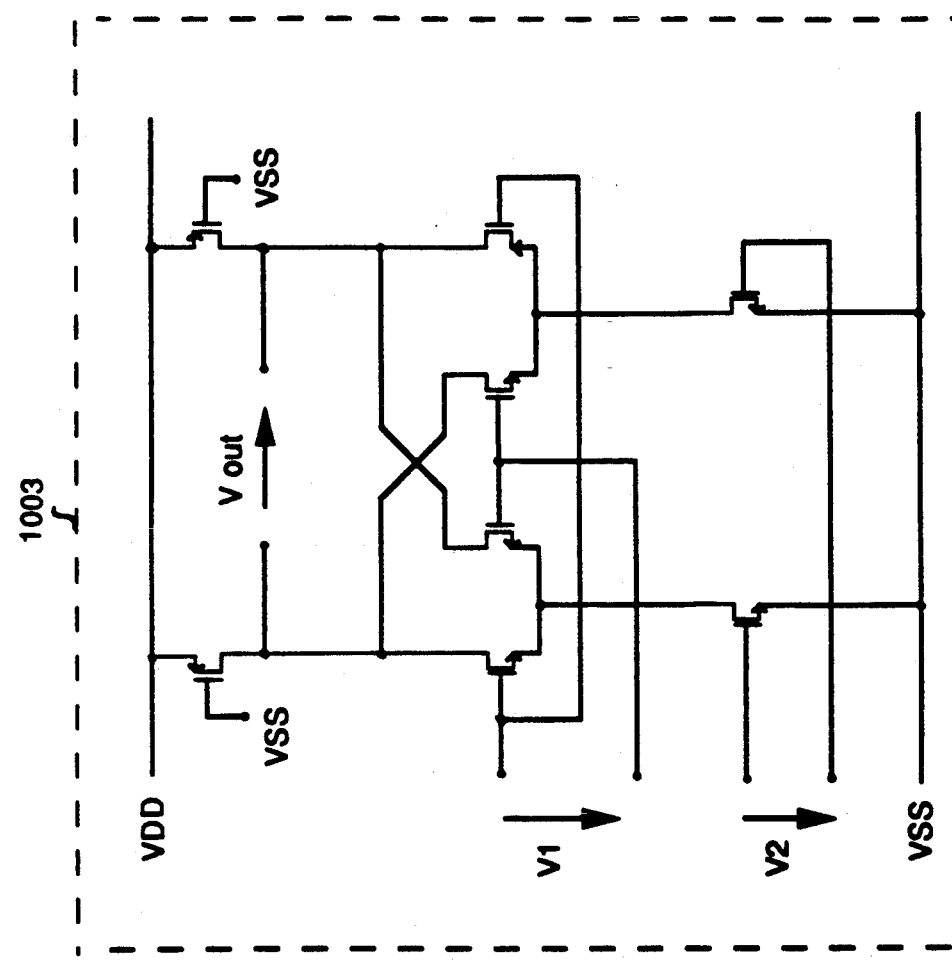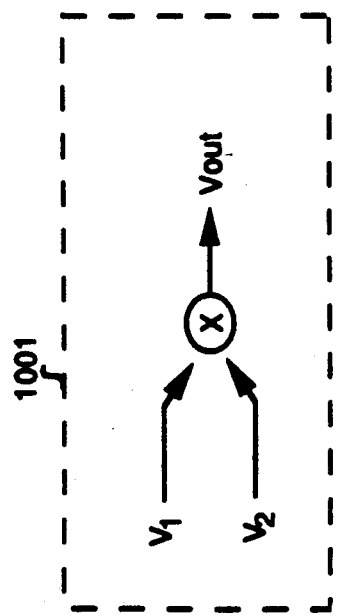
FIG. 10
(PRIOR ART)

METHOD AND APPARATUS FOR CLOCK RECOVERY

FIELD OF THE INVENTION

The present invention relates to analog and digital circuitry in general, and more particularly, to circuitry which develops a periodic signal (e.g., a "clock") having a bounded phase relationship with respect to an input signal.

BACKGROUND OF THE INVENTION

A typical communication system, such as that depicted in FIG. 1, comprises a transmitter 101 which sends information bearing signals over a communications channel 103 to a receiver 105. When the signals are defined only at discrete values (e.g., $<=0.8$ volts and $>=3.5$ volts) the signals are commonly referred to as "digital signals" (in contrast to "analog signals" which are defined continuously within a given range of values). Traditionally, digital signals are transmitted sequentially: each being sent for a constant amount of time and during a precisely defined interval of time. Typically, the time interval is defined for the transmitter by an electronic metronome known to those skilled in the art as a "clock signal" (hereinafter "clock"). A clock is typically generated by a crystal oscillator and is embodied as electric squarewave signal with constant frequency and a 50% duty cycle. FIG. 2 at 201 shows a waveform illustrative of a clock.

With the beginning of each cycle or "tick" of the clock, one clock period ends (and the transmission of one signal ends) and a second clock period begins (and the transmission of the next signal begins). FIG. 2 at 207 shows a typical waveform for an information bearing signal over time and with respect to clock 201. As is well known, capacitance, inductance and other parasitic effects prohibit the information bearing signal on lead 207 from changing instantaneously from one defined value to another. The signal may assume, therefore, undefined values during the period of transition. FIG. 2 at 213 shows a typical transition from a logical "0" to a logical "1" for the illustrative waveform 207.

To assure that the receiver correctly interprets the incoming signals, the receiver must selectively read the incoming signals only at instants when the signals have stabilized and not when they are undergoing transition. This requires the receiver to know when the incoming signals are stable and when they are not. Advantageously, the receiver also has an electronic metronome, synchronized to the incoming signal which dictates "read now—wait, read now—wait, read now—wait . . ." Typically, the receiver has information regarding the frequency or frequencies of the transmitter's clock and has a clock with that same frequency. The receiver's clock, however, will, without more, bear no phase relationship to the incoming signal and thus the receiver will have no synchronized metronome to assist it in reading the incoming signal. To generate a clock which is synchronized with respect to the incoming signal, the receiver may advantageously utilize a "clock recovery system".

The phase of the incoming signal may be discerned or "recovered" with a clock recovery system. FIG. 3 shows how a clock recovery system may be used in a receiver to correctly read the incoming signal and to extract the transmitted information. Incoming signal on lead 301 is fed into clock recovery system 311 to generate a periodic waveform 313 or "recovered clock". The incoming signal 301 is also distributed with optional delay to a data extraction device 307. The periodic waveform 313 and the signal 305 are processed in the data extractor 307 to generate the output 309. Data extractor 307 could be as simple as a well-known Master/Slave D flip-flop, with signal 305 connected to the D input of the flip-flop, signal 313 connected to the clock input of the flip-flop and output 309 connected to the Q output of the flip-flop.

At least two clock recovery techniques are currently known. First, the transmitter's clock may be transmitted to the receiver on a communication channel in parallel to the channel carrying the incoming signals. The receiver can then estimate the phase of the incoming signals from the phase of the transmitter's clock. This technique, however, is disadvantageous in that it requires additional hardware (e.g., the extra communication channel) and is subject to phase skew between the transmitted clock and the incoming signal.

Alternately, the phase of the incoming signals may be recovered directly from the incoming signals themselves because the incoming signals carry the information needed to discern its phase. At least two techniques are known which recover the phase of the incoming signals from the incoming signals themselves.

The first is the open-loop clock recovery system representatively taught by I. Dorros et al., *An Experimental* 224 *Mb/s Digital Repeatered Line*, The Bell System Technical Journal, Vol. 45, No. 7, pp. 993–1043 (September 1966). Open-loop systems are characterized by a high-Q, narrow bandpass filter (e.g., a SAW filter) yet may be disadvantageous in that they typically require expensive non-integrated components, hundreds of incoming signal transitions to reach steady state and may be susceptible to temperature variations and age.

The second is the closed-loop clock recovery system. A representative closed-loop clock recovery system is taught by R. R. Cordell et al. in *A 50 Mhz Phase- and Frequency-Locked Loop*, IEEE Journal of Solid State Circuits, Vol. SC-14, No. 6, pp 1003–1010 (December 1979). Closed-loop systems are characterized by a phase-locked loop which attempts to lock onto the phase of the incoming signal. While closed-loop recovery systems are self-adjusting (thus mitigating temperature and aging effects) and can be easily integrated, they are disadvantageous in typically requiring hundreds of incoming signal transitions to reach steady state.

While these clock recovery mechanisms may be satisfactory for signals which carry voice communications, they may be disadvantageous for signals which carry non-voice information.

SUMMARY OF THE INVENTION

The present invention provides a method and apparatus for recovering the phase of a signal while avoiding many of the costs and restrictions associated with prior apparatus and methods. Specifically, embodiments of the present invention are ideally suited for fabrication on a single integrated circuit and typically generate a "recovered clock" (i.e., recover the phase of an incoming signal) more quickly than methods in the prior art.

These results are obtained in an illustrative embodiment of the present invention in which an incoming signal is fed into a gated oscillator and the complement of the incoming signal is fed into a matching gated oscillator. Advantageously, the respective outputs of the two oscillators are fed into a Boolean NOR gate. When the gated oscillators are designed to oscillate at the frequency of the incoming signal, the output waveform from the NOR gate will have a bounded phase relationship with respect to the incoming signal.

BRIEF DESCRIPTION OF THE DRAWINGS

FIG. 2 presents a typical clock and data signal as used in a digital communication system (prior art).

FIG. 10 presents illustrative logical and transistor schematics of a phase detector useful in the circuit of FIG. 8.

DETAILED DESCRIPTION

1. Definitions

Phase Bounded Relationship—Two periodic waveforms are said to have a "phase bounded relationship" when the two waveforms have the same frequency and their relative phase stays within a given range.

2. An Embodiment Using Gated Oscillators

Figure 1:
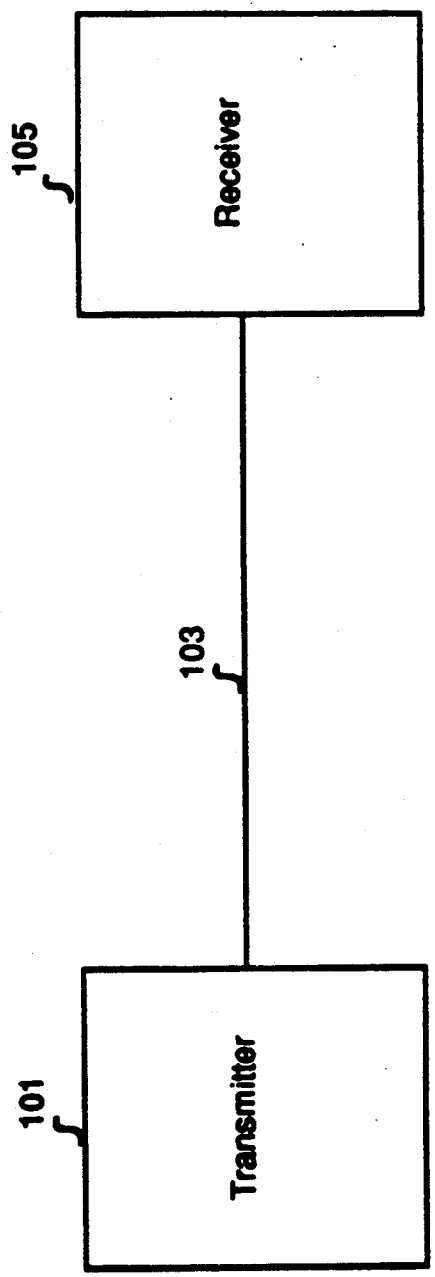
FIG. 1 presents a block diagram of a communication system (prior art).
Figure 3:
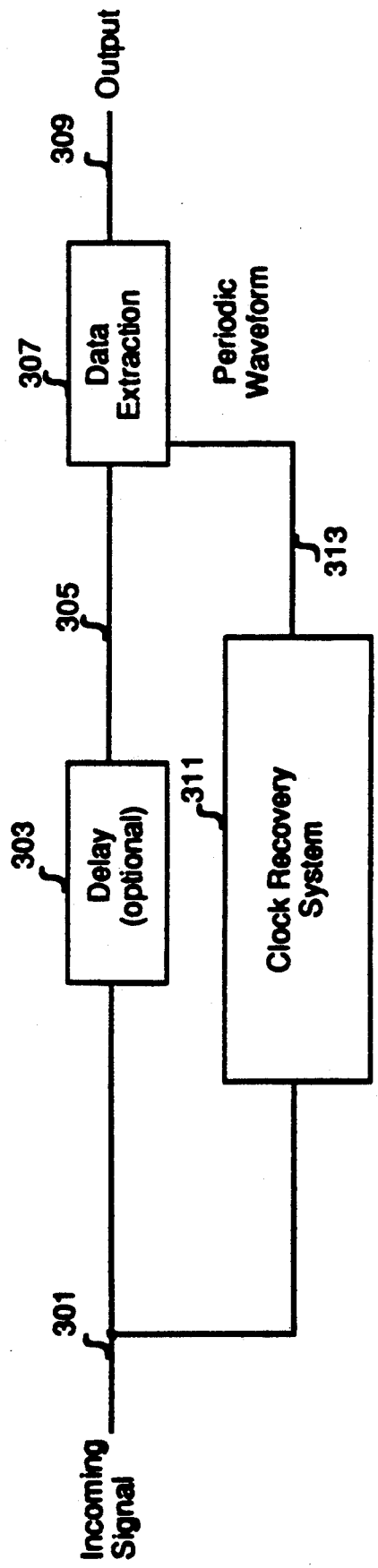
FIG. 3 presents a block diagram of a receiver which incorporates a clock recovery system (prior art).
Figure 4:
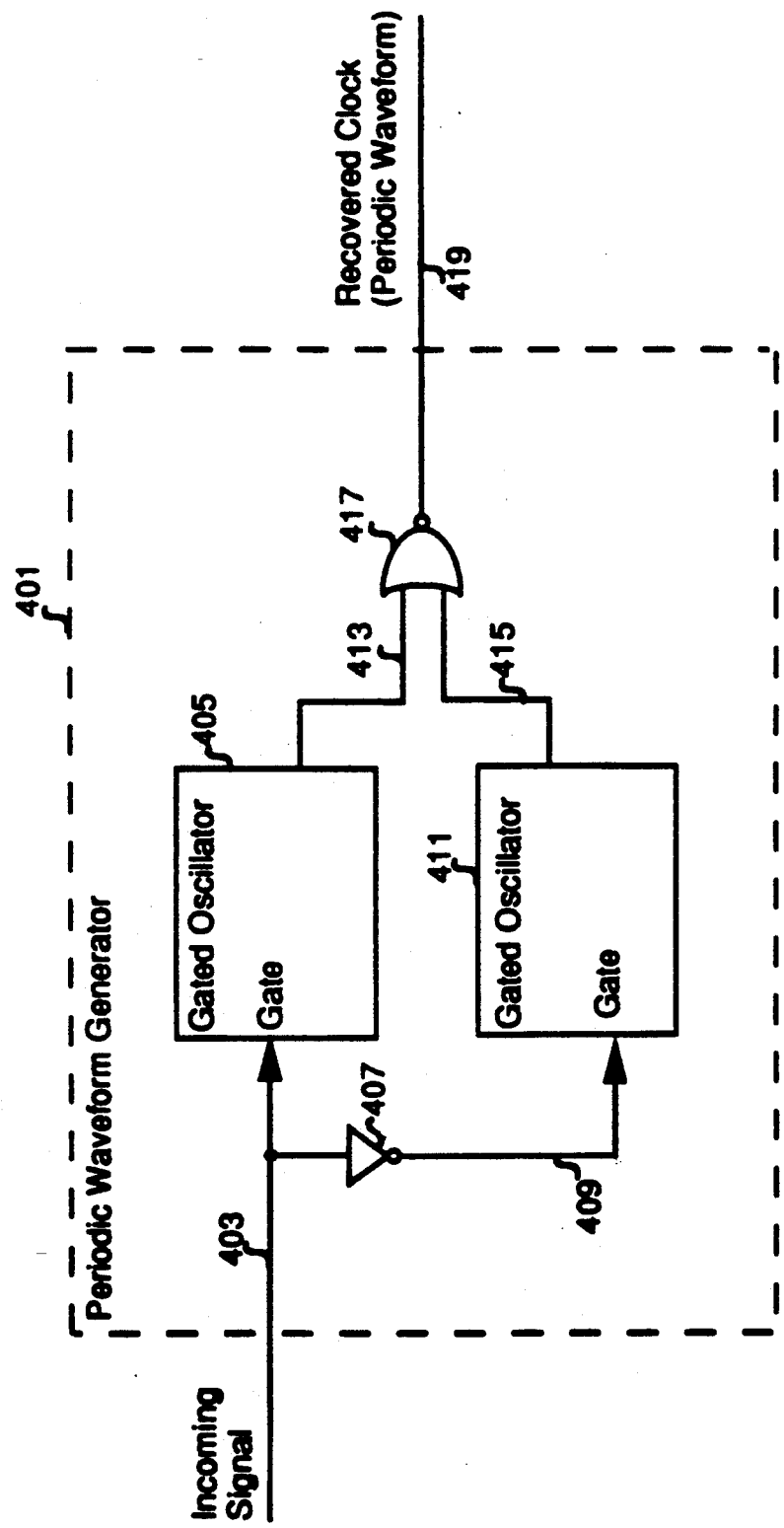
FIG. 4 presents an illustrative embodiment of the present invention which utilizes a pair of matched gated oscillators.
Figure 7:
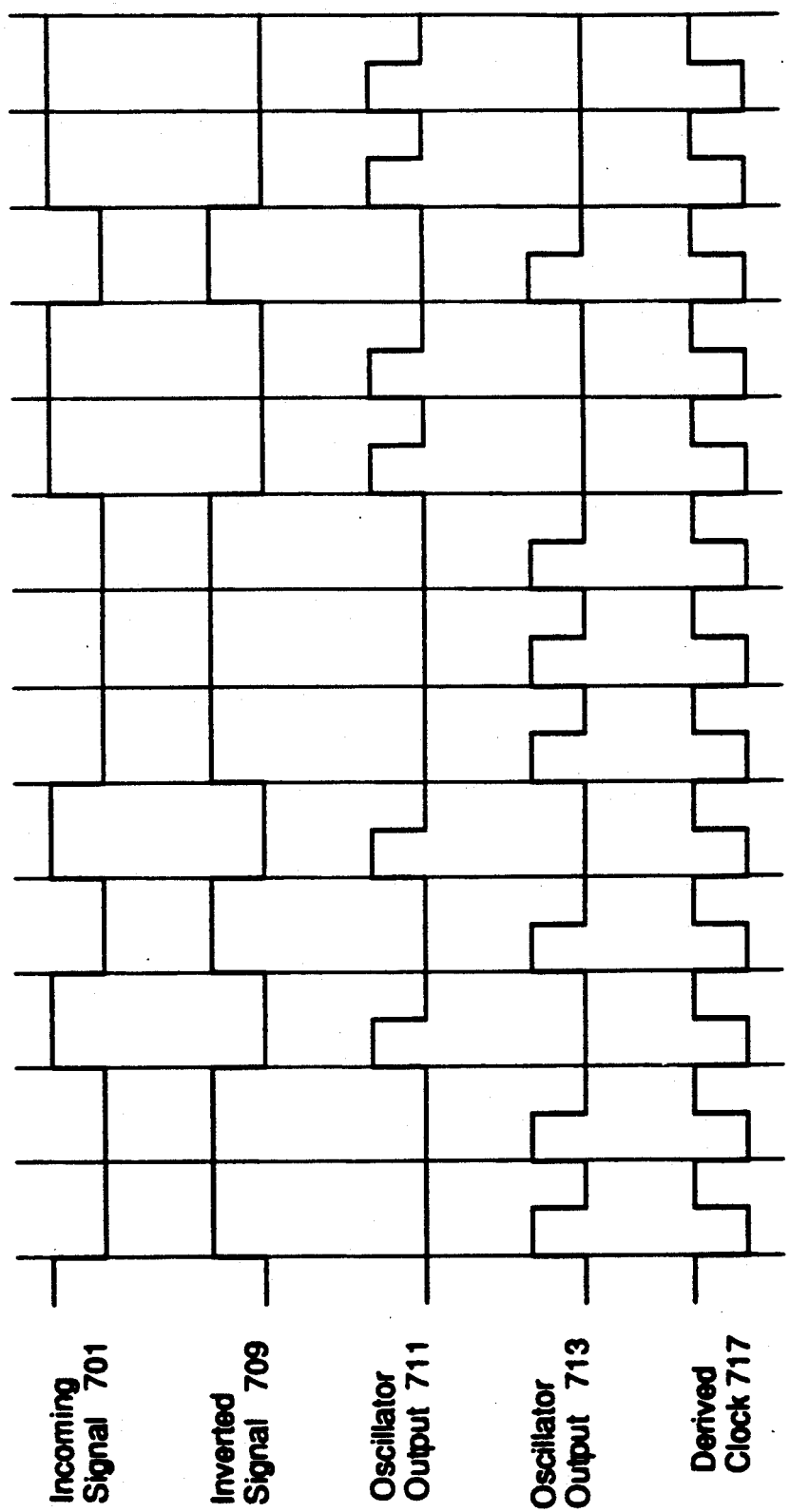
FIG. 7 presents typical timing diagrams associated with the illustrative embodiment shown in FIG. 4.

FIG. 4 of the present application discloses a block diagram of one embodiment of the present invention. The embodiment accepts as input an incoming signal on lead 403 which may change states at periodic intervals as defined by a clock, of known frequency, at transmitter 101. A typical incoming signal is shown in FIG. 7 at 701.

The incoming signal on lead 403 is fed into the gate of gated oscillator 405 and into inverter 407. The output on lead 413 of gated oscillator 405 is fed into Boolean NOR gate 417. The output on lead 409 of inverter 407 is fed into the gate of gated oscillator 411. The output on lead 415 of gated oscillator 411 is also fed into Boolean NOR gate 417. The output on lead 419 of Boolean NOR gate 417 is the periodic waveform or "recovered clock" n which may be used by the receiver to appropriately read the incoming signal. A typical recovered clock corresponding to incoming signal waveform 701 is shown in FIG. 7 at 717.

Figure 5:
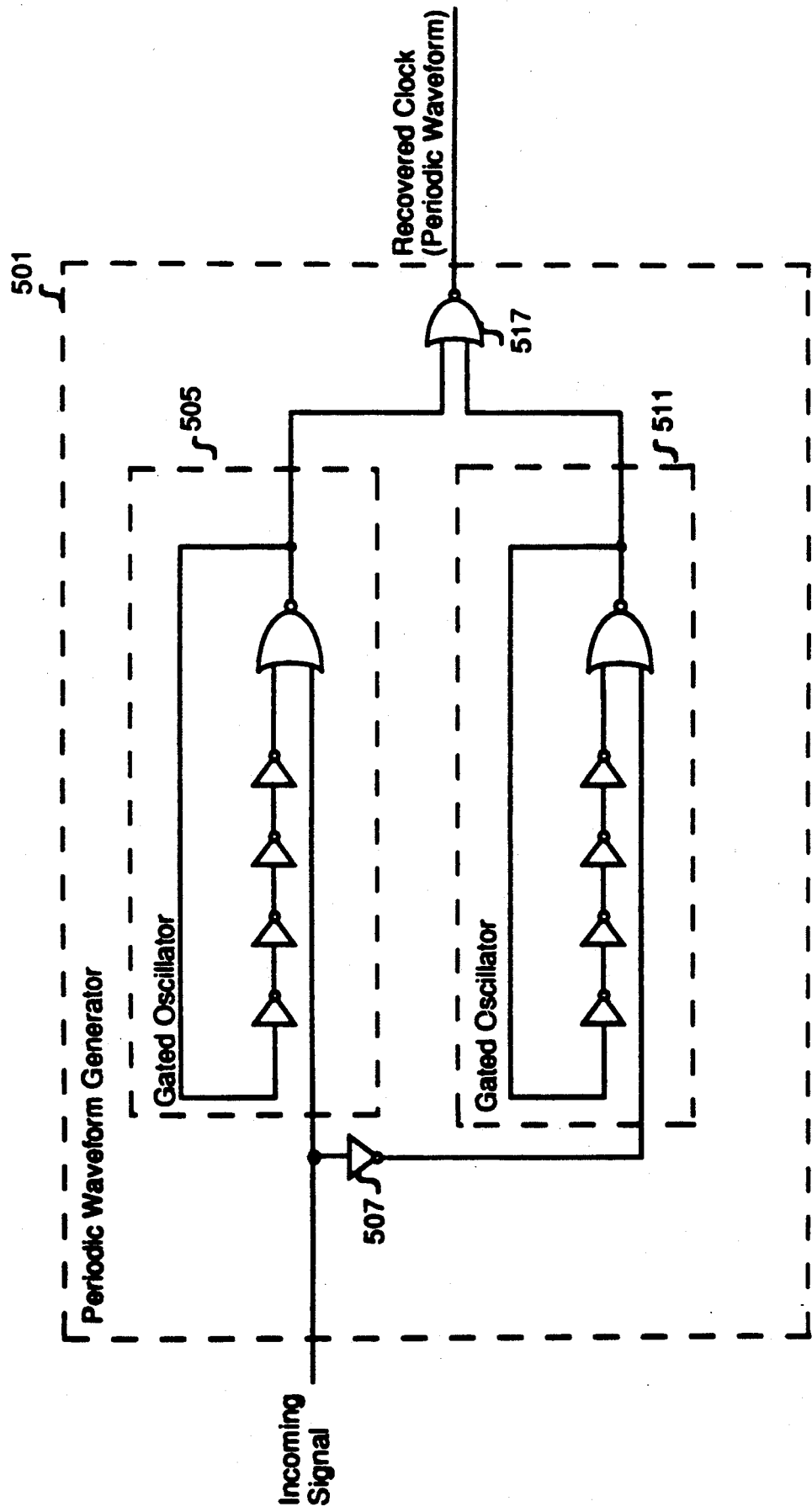
FIG. 5 presents an illustrative logic schematic of the embodiment shown in FIG. 4.
Figure 6:
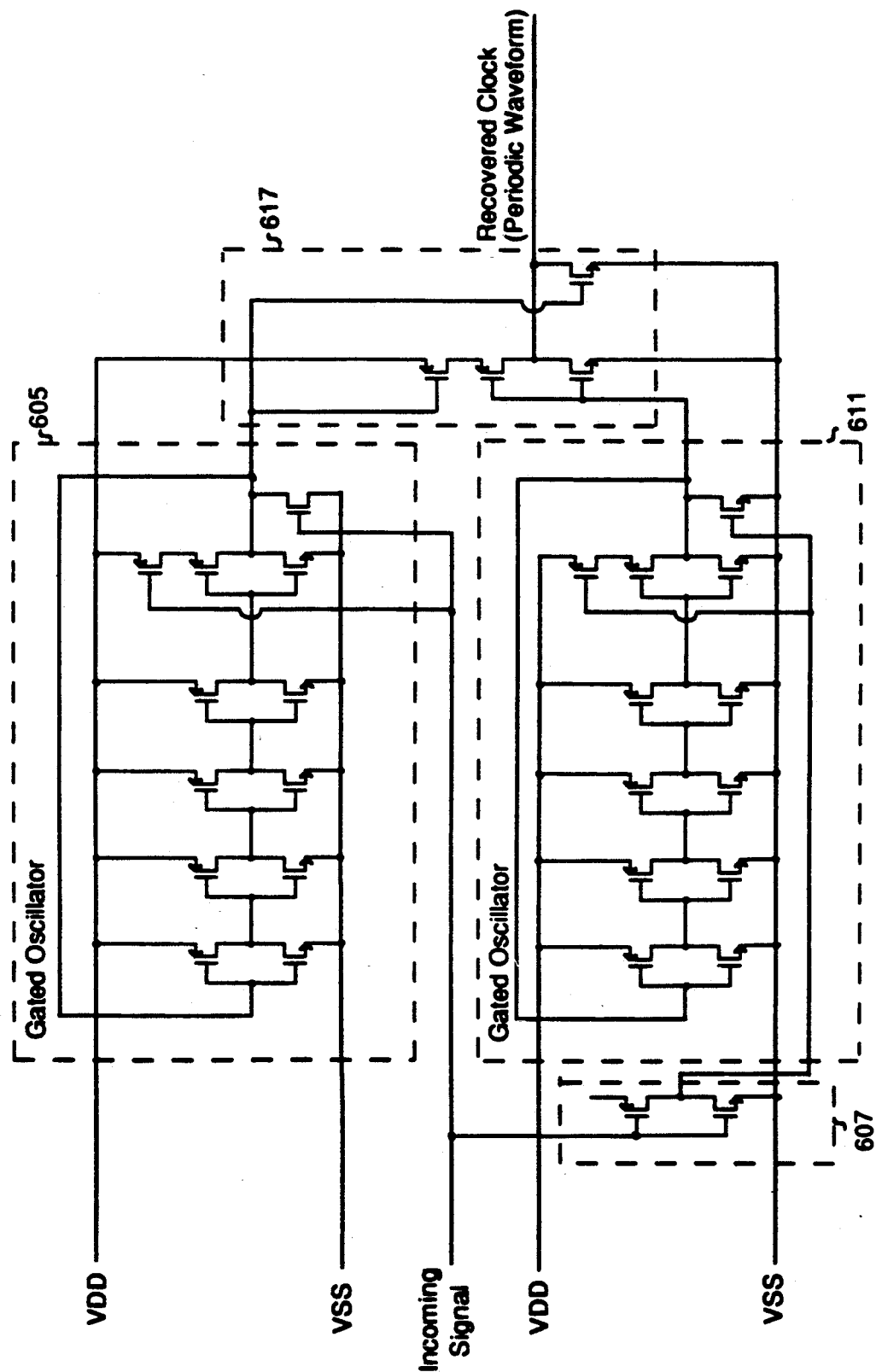
FIG. 6 presents an illustrative transistor schematic corresponding to the logic schematic shown in FIG. 5.

A salient characteristic of the illustrative embodiment is the pair of gated oscillators, 405 and 411, each of which is able to generate an oscillatory signal at a given frequency (specifically, the same frequency as the transmitter's clock). Advantageously, each gated oscillator outputs no signal when its input is above a first threshold voltage and outputs a periodic waveform when its input is below a second threshold voltage. Advantageously, each gated oscillator begins oscillating at the same point in its oscillatory cycle each time its input falls below the second threshold. A logic schematic and transistor schematic of an illustrative gated oscillator is shown at 505 and 511 in FIG. 5 and at 605 and 611 in FIG. 6, respectively. Although the transistor schematic in FIG. 6 is shown using CMOS technology, it will be clear to those of ordinary skill in the art how to implement the circuit using other discrete and/or integrated circuit technologies (either electrical or optical).

The illustrative embodiment in FIG. 4 advantageously also comprises an inverter 407 and a Boolean NOR gate 417. A logic schematic and transistor schematic of an illustrative inverter is shown at 507 in FIG. 5 and at 607 in FIG. 6, respectively. A logic schematic and transistor schematic of an illustrative Boolean NOR gate is shown at 517 in FIG. 5 and at 617 in FIG. 6, respectively. Although the transistor schematic is shown using CMOS technology, it will be clear to those of ordinary skill in the art how to implement the circuit using other discrete and/or integrated circuit technologies (either electrical or optical).

The circuit of FIG. 4 operates as follows (see accompanying diagram in FIG. 7). When the circuit is powered on (and whenever the incoming signal on lead 403 changes phase) and the incoming signal voltage is above a first threshold, gated oscillator 405 does not oscillate and outputs a flat (Boolean logical "0") waveform 713. In such a circumstance, however, gated oscillator 411 begins oscillation at zero phase and outputs waveform 711.

The circuit of FIG. 4 is configured in such a way that one and only one of the gated oscillators 405 and 411 is operating to produce a pulse sequence at any one time. Each is arranged such that when its input signal level experiences a change from above a first threshold to below a second threshold, it ceases oscillation. Conversely, when the input of each experiences a change from below a third threshold to above a fourth threshold, it immediately begins oscillation at phase zero. Because of inverter 407, it is assumed that only one of gated oscillators 405 and 411 has an input below its activation threshold at any one time.

When the circuit is powered on (and whenever the incoming signal on lead 403 changes phase) and the incoming signal is below a second threshold, gated oscillator 411 is idle while gated oscillator 405 begins oscillation at zero phase (as shown at 711 and 713, respectively). Whenever a voltage transition (from high to low or low to high) occurs on incoming signal on lead 403, one oscillator becomes idle while the other starts to oscillate at precisely the same point in the oscillatory cycle. As shown in FIG. 7 the respective outputs of gated oscillator 405 and gated oscillator 411 are fed into Boolean NOR gate 417. The output of NOR gate 417 is waveform 717 and may be used to extract information from the incoming signal on lead 701. It will be clear to those of ordinary skill in the art how to substitute other logic, including a Boolean NAND gate, for Boolean NOR gate 417.

It will be clear to those of ordinary skill in the art how to design alternate circuitry which accomplishes the same functionality as that taught here.

3. An Embodiment Using Indirect Tuning

Figure 8:
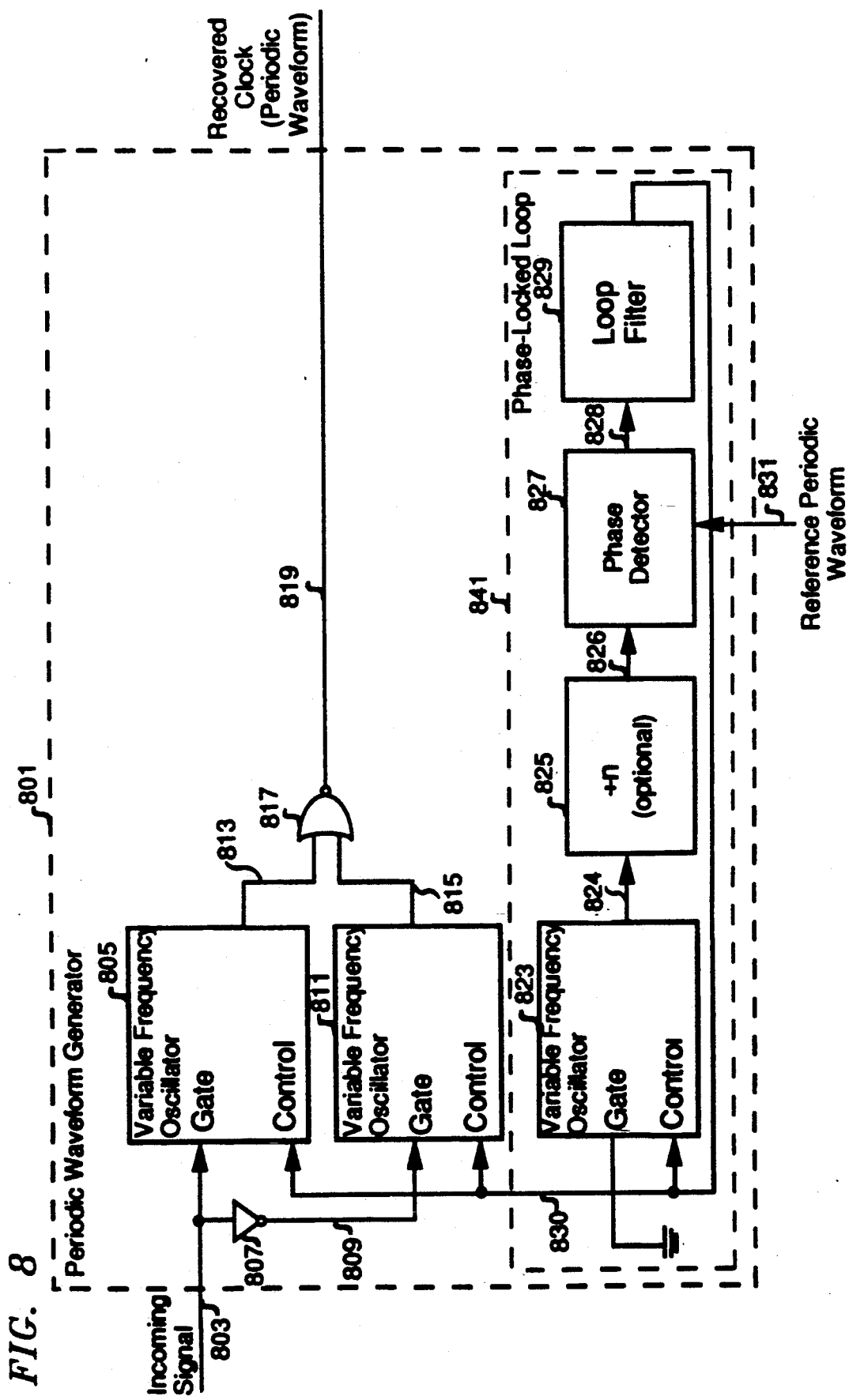
FIG. 8 presents an illustrative embodiment of the present invention utilizing indirect tuning.

FIG. 8 discloses a block diagram of one embodiment of the present invention which provides means for tuning oscillators of the type described above. The embodiment accepts as input an incoming signal on lead 803 which may change states at periodic intervals as defined by a clock, of known frequency, in transmitter 101. In virtually all respects, the illustrative embodiment shown in FIG. 8 performs as does the illustrative embodiment in FIG. 4. The embodiment in FIG. 8 additionally provides for "indirectly" tuning the oscillators with phase-locked loop 841.

The embodiment of FIG. 8 is advantageous when a semiconductor manufacturer has difficulty in fabricating the embodiment in FIG. 4 within tolerances acceptable to that manufacturer. The embodiment of FIG. 8 is advantageously fabricated on a single integrated circuit and, therefore, may be less finicky to manufacturing tolerances than the embodiment in FIG. 4.

The incoming signal on lead 803 is fed into the gate of gated variable frequency oscillator 805 (henceforth "GVFO") and into inverter 807. The output on lead 813 of GVFO 805 is fed into Boolean NOR gate 817. The output on lead 809 of inverter 807 is fed into the gate input of GVFO 811. The output on lead 815 of GVFO 811 is also fed into Boolean NOR gate 817. The output on lead 819 of Boolean NOR gate 817 is the periodic waveform or "recovered clock" which may be used by the receiver to appropriately read the incoming signal. A typical recovered clock corresponding to incoming signal on lead 803 is shown in FIG. 7 at 717.

In typical operation, a phase-locked loop 841 receives a reference periodic waveform 831 and sends a tuning signal on lead 830 into the respective control inputs of GVFO 805 and GVFO 811. Illustratively, phase-locked loop 841 comprises GVFO 823, counter 825 (optional), phase detector 827 and loop filter 829. The design and operation of phase-locked loops is well known to those of ordinary skill in the art.

A salient characteristic of the illustrative embodiment is the triplet of GVFOs, 805, 811 and 823, each of which is capable of being tuned to oscillate at a given frequency (specifically, the same frequency as the transmitter's clock). A signal fed into each GFVO's "control" inputs directs the frequency at which the GFO should oscillate. Advantageously, each GVFOs outputs no signal when its respective input is above a first threshold voltage and outputs a periodic waveform when its respective input is below a second threshold voltage. Advantageously, each GVFO begins oscillating at the same point in its oscillatory cycle each time its input falls below the second threshold. Advantageously, each GVFO has precisely the same electrical and physical characteristics. The gate input of GVFO 823 is advantageously tied to ground in order to assure that it continuously oscillates.

Figure 9:
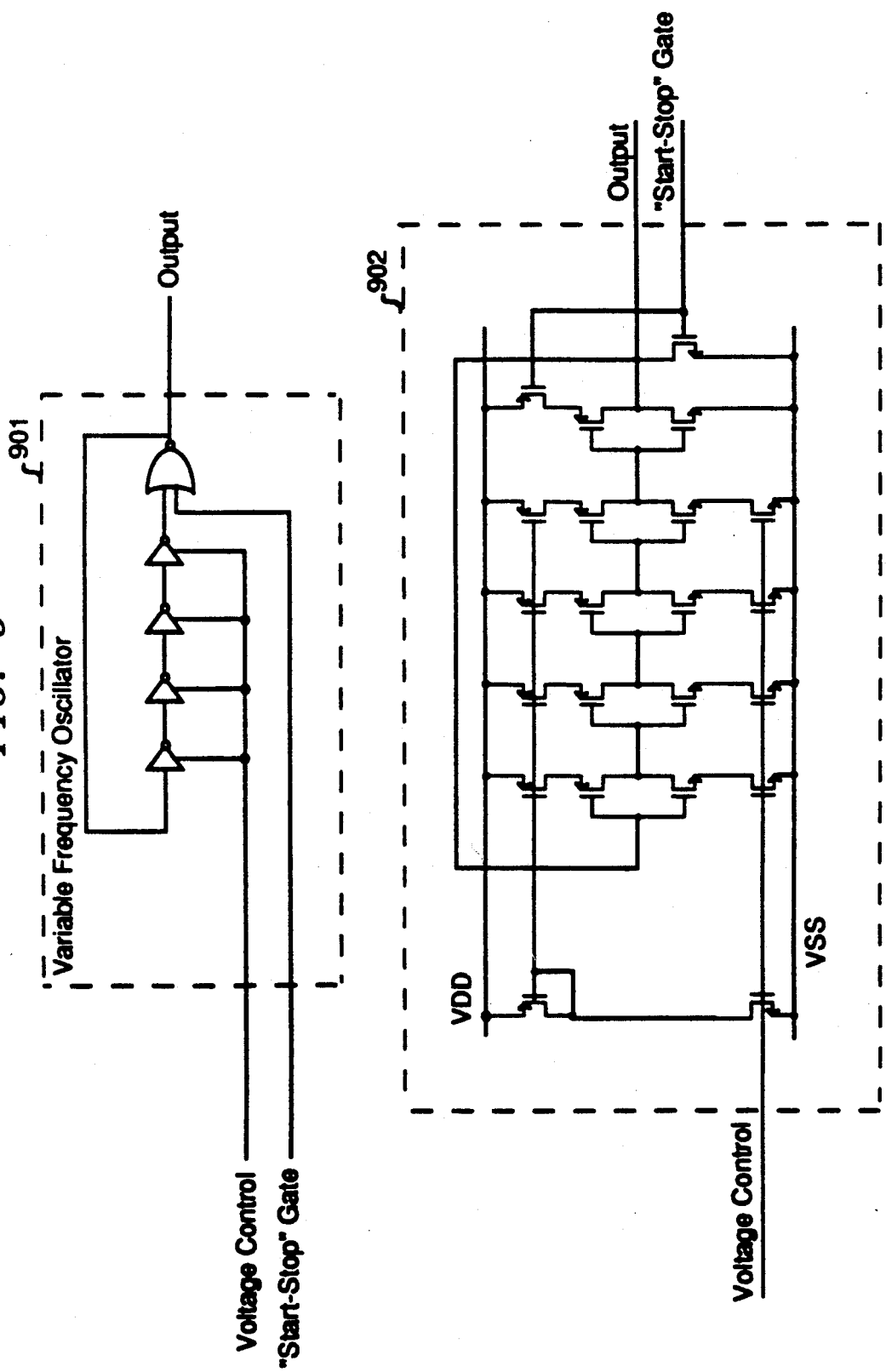
FIG. 9 presents illustrative logical and transistor schematics of a gated variable frequency oscillator useful in the circuit of FIG. 8.

A logic schematic and transistor schematic of an illustrative GVFO is shown at 901 and 903 in FIG. 9. Although the transistor schematic is shown using CMOS technology, it will be clear to those of ordinary skill in the art how to implement the circuit using other discrete and/or integrated circuit technologies (either electrical or optical).

A logic schematic and transistor schematic of an illustrative phase detector (as shown at 827 in FIG. 8) is shown at 1001 and 1003 in FIG. 10. It will be clear to those of ordinary skill in the art how to implement phase detectors using other discrete and/or integrated circuit technologies (either electrical or optical).

Figure 11:
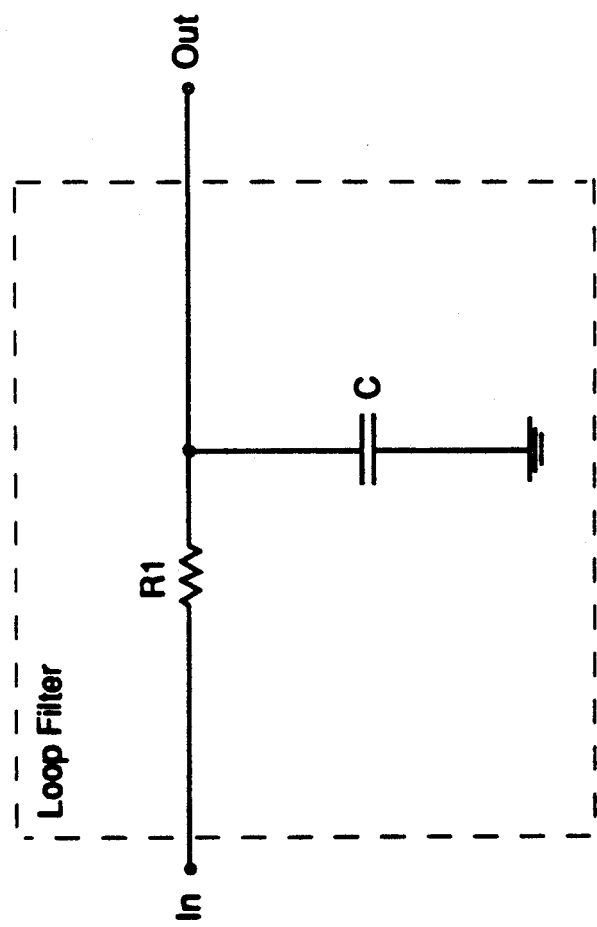
FIG. 11 presents an illustrative schematic of the loop filter useful in the circuit of FIG. 8.

A schematic of an illustrative loop filter (as shown at 829 in FIG. 8) is shown in FIG. 11. The loop filter should be designed so that, so far as is possible, only the DC component of the signal should pass unattenuated and all frequencies above DC should be attenuated as much as possible. It will be clear to those of ordinary skill in the art how to implement loop filters using other discrete and/or integrated circuit technologies (both electrical and optical).

The illustrative embodiment in FIG. 8 advantageously also comprises an inverter 807 and a Boolean NOR gate 817. A logic schematic and transistor schematic of an illustrative inverter is shown at 507 in FIG. 5 and 607 in FIG. 6, respectively. A logic schematic and transistor schematic of an illustrative Boolean NOR gate is shown at 517 in FIG. 5 and 617 in FIG. 6, respectively. Although the transistor schematic is shown using CMOS technology, it will be clear to those of ordinary skill in the art how to implement the circuit using other discrete and/or integrated circuit technologies (both electrical and optical). It will be clear to those of ordinary skill in the art how to design alternate circuitry which accomplishes the same functionality as that taught here.

The circuit of FIG. 8 operates as follows. Phase-locked loop 841 continuously tunes GVFO 805 and GVFO 811 to oscillate at a frequency determined by reference periodic waveform 831. It should be noted that there is no feedback from GVFO 805 or GVFO 811 into phase-locked loop 841. Thus, phase-locked loop 841 tunes GVFO 805 and GVFO 811 based on the assumption that the electrical and physical characteristics affecting the operation of GVFO 823 within phase-locked loop 841 are virtually identical to those affecting GVFO 805 and GVFO 811. It is therefore advantageous to fabricate GVFO 805, 811 and 823 on a single integrated circuit and with each having virtually identical physical and electrical characteristics (e.g., layouts, voltages).

The circuit of FIG. 8 operates as follows. When the circuit is powered on (and whenever the incoming signal on lead 803 changes phase) and the incoming signal voltage is above a first threshold, GVFO 805 does not oscillate and outputs a flat (Boolean logical "0") waveform 713. In such a circumstance, however, GVFO 811 begins oscillation at zero phase and outputs waveform 711.

The circuit of FIG. 8 is configured in such a way that one and only one of the GVFO 805 and 811 is operating to produce a pulse sequence at any one time. Each is arranged such that when its input signal level experiences a change from above a first threshold to below a second threshold, it ceases oscillation. Conversely, when the input of each experiences a change from below a third threshold to above a fourth threshold, it immediately begins oscillation at phase zero. Because of inverter 807, it is assumed that only one of GVFO 805 and 811 has an input below its activation threshold at any one time.

When the circuit is powered on (and whenever the incoming signal on lead 803 changes phase) and the incoming signal is below a second threshold, GVFO 811 is idle while GVFO 805 begins oscillation at zero phase (as shown at 711 and 713, respectively). Whenever a voltage transition (from high to low or low to high) occurs on incoming signal on lead 803, one oscillator becomes idle while the other starts to oscillate at precisely the same point in the oscillatory cycle. As shown in FIG. 7 the respective outputs of gated oscillator 805 and GVFO 811 are fed into Boolean NOR gate 817. The output of NOR gate 817 is waveform 717 and may be used to extract information from the incoming signal 701. It will be clear to those of ordinary skill in the art how to substitute other logic, including a Boolean NAND gate, for Boolean NOR gate 817.

It will be clear to those of ordinary skill in the art how to design alternate circuitry which accomplishes the same functionality as that taught here.

4. An Embodiment Using Direct Tuning

Figure 12:
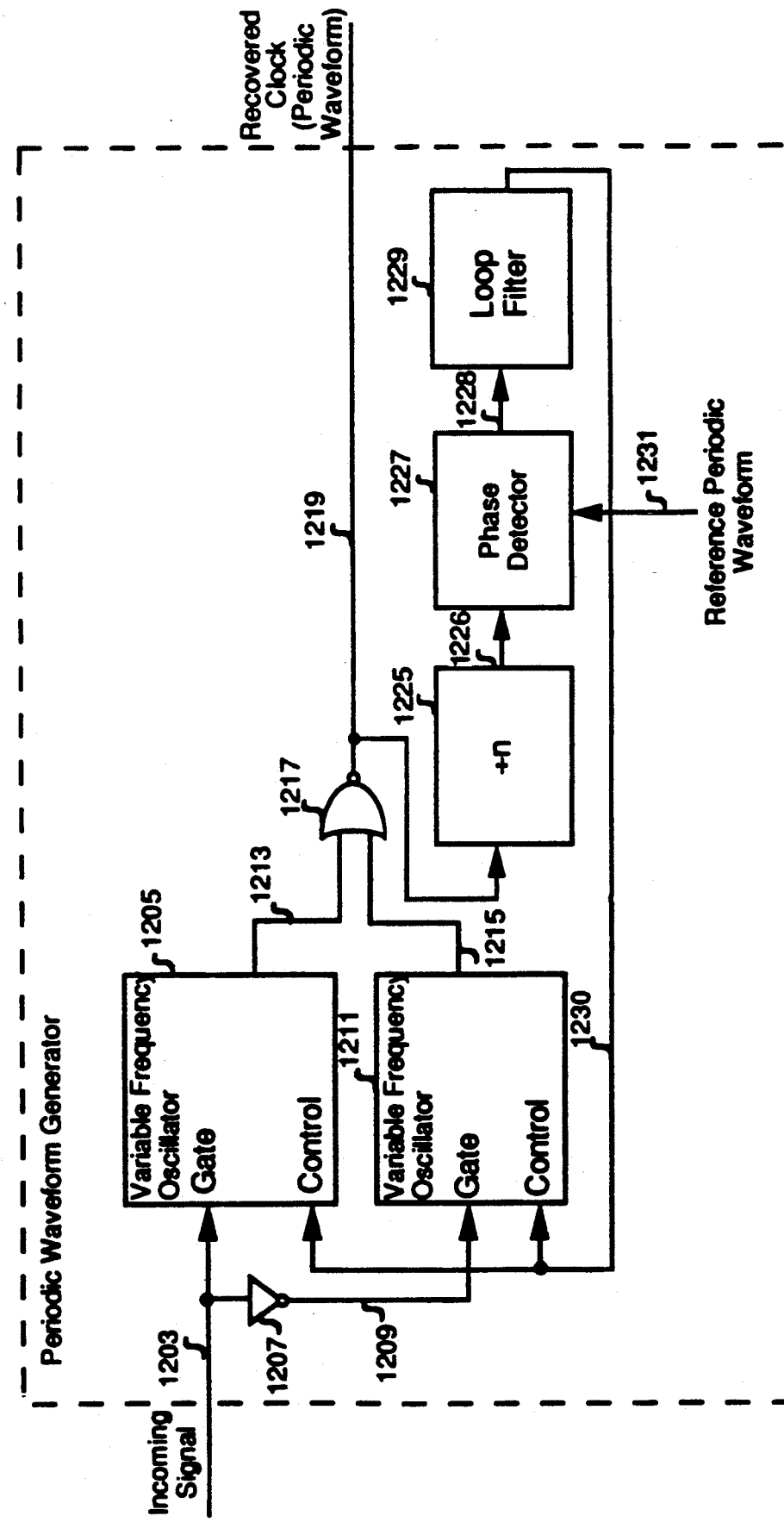
FIG. 12 presents an illustrative embodiment of the present invention utilizing direct tuning.

FIG. 12 discloses a block diagram of one embodiment of the present invention which provides meams for tuning oscillators of the type described above. The embodiment accepts as input an incoming signal on lead 1203 which may change states at periodic intervals as defined by a clock, of known frequency, in transmitter 101. In virtually all respects, the illustrative embodiment shown in FIG. 12 performs as does the illustrative embodiment in FIG. 4 and FIG. 8. The embodiment in FIG. 12 additionally provides for "directly" tuning the oscillators with phase-locked loop 841 which utilizes the recovered clock 1219.

The embodiment of FIG. 12 is advantageous when a semiconductor manufacturer has difficulty in fabricating the embodiment in FIG. 4 within tolerances acceptable to that manufacturer. The embodiment of FIG. 8 is advantageously fabricated on a single integrated circuit but need not be.

5. An Enbodiment Using a Single Oscillator

Figure 13:
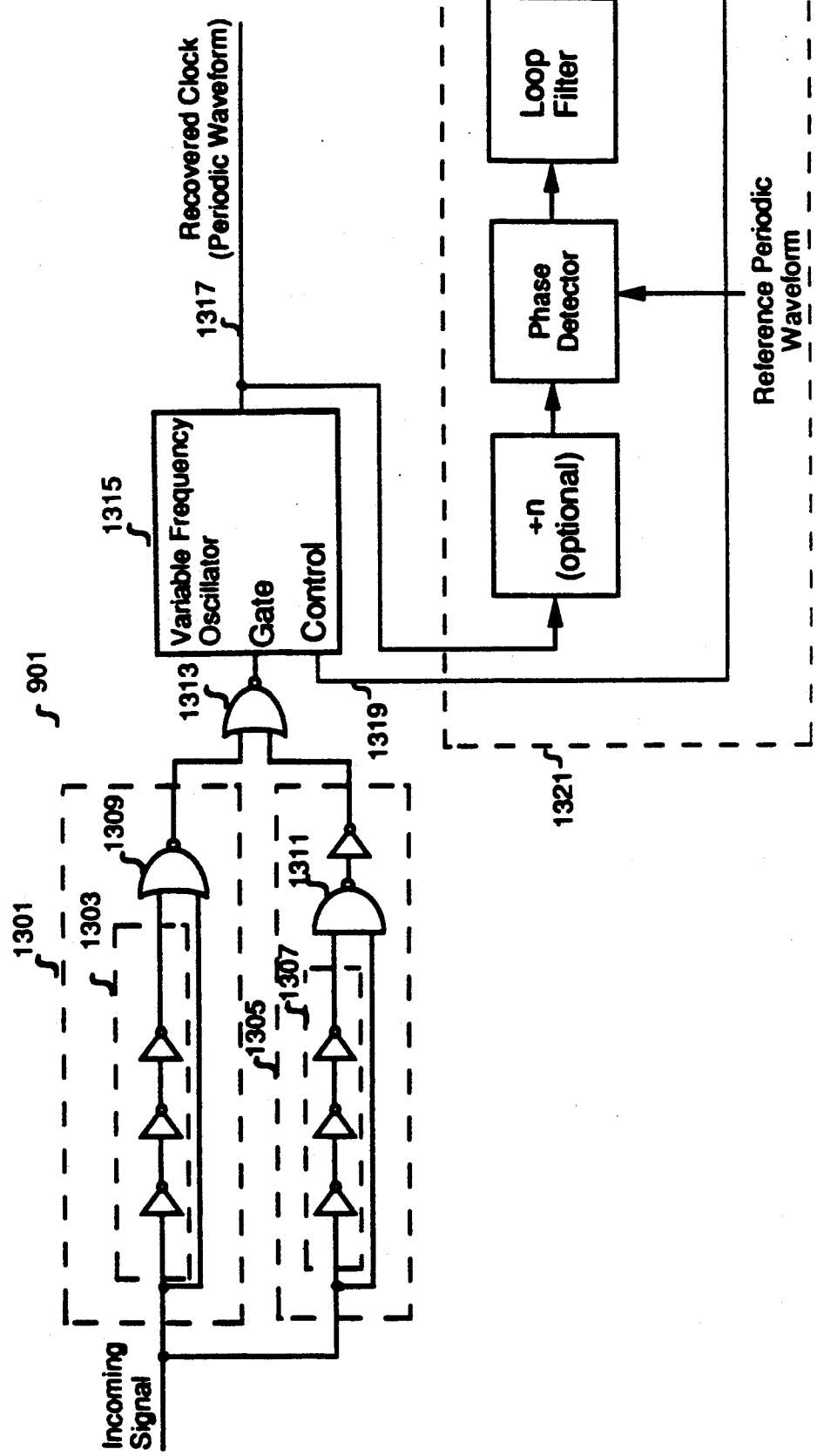
FIG. 13 presents an illustrative embodiment of the present invention which utilizes a single variable frequency oscillator.

FIG. 13 discloses a block diagram of one embodiment of the present invention which provides means for tuning oscillators of the type described above. The embodiment accepts as input an incoming signal which may change states at periodic intervals as defined by a clock, of known frequency, in transmitter 101. The embodiment depicted in FIG. 13 uses edge detectors 1301 and 1305 and Boolean NOR gate 1313 to turn GVFO 1315 alternately ON and OFF. The embodiment in FIG. 13 can be fabricated with means 1321 for tuning GVFO 1315 or not depending on the particular application. Utilization of means for tuning (e.g., a phase-locked loop) will advantageously improve the precision of the recovered clock.

6. An Embodiment Using a Single Oscillator

Figure 14:
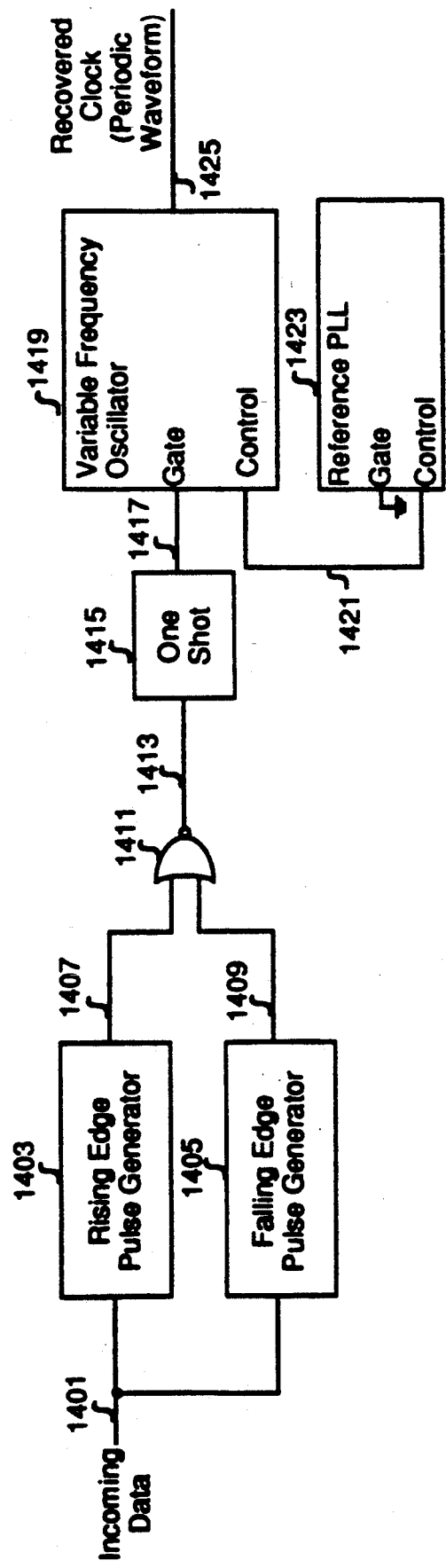
FIG. 14 presents an illustrative embodiment of the present invention which utilizes a single variable frequency oscillator.

FIG. 14 discloses a block diagram of one embodiment of the present invention which provides means for tuning oscillators of the type described above. The embodiment accepts as input an incoming signal which may change states at periodic intervals as defined by a clock, of known frequency, in transmitter 101. The embodiment depicted in FIG. 14 uses edge detectors 1403 and 1405. Boolean NOR gate 1411 and one-shot 1415 to turn GVFO 1419 alternately ON and OFF. The embodiment in FIG. 14 can be fabricated with means 1423 for tuning GVFO 1419 or not depending on the particular application. Utilization of means for tuning (e.g., a phase-locked loop) will advantageously improve the precision of the recovered clock.

We claim:

1. A method of creating a periodic signal which has a bounded phase relationship with respect to an input signal comprising the steps of:
    operative on said input signal above a first threshold, generating a first oscillatory signal;
    operative on said input signal below a second threshold, generating a second oscillatory signal; and
    generating said periodic signal based on said first oscillatory signal and said second oscillatory signal.

2. The method of claim 1 wherein said step of generating said periodic signal comprises the step of forming the Boolean NOR of said first oscillatory signal and said second oscillatory signal.

3. The method of claim 1 wherein said step of generating said periodic signal comprises the step of forming the Boolean NAND of said first oscillatory signal and said second oscillatory signal.

4. The method of claim 1 further comprising the step of adjusting the frequency of said first oscillatory signal and said second oscillatory signal to coincide with the frequency of a reference periodic waveform.

5. The method of claim 4 wherein a phase-locked loop is used to adjust the frequency of said first oscillatory signal and said second oscillatory signal.

6. An apparatus for creating a periodic signal which has a bounded phase relationship with respect to an input signal, said apparatus comprising:
    means, operative on said input signal above a first threshold, for generating a first oscillatory signal;
    means, operative on said input signal below a second threshold, for generating a second oscillatory signal; and
    means for generating said periodic signal based on said first oscillatory signal and said second oscillatory signal.

7. The apparatus of claim 6 wherein said means for generating said periodic signal comprises a Boolean NOR gate.

8. The apparatus of claim 6 wherein said means for generating said periodic signal comprises a Boolean NAND gate.

9. The apparatus of claim 6 further comprising means for adjusting the frequency of said first oscillatory signal and said second oscillatory signal to coincide with the frequency of a reference periodic signal.

10. The apparatus of claim 6 further comprising a phase-locked loop for adjusting the frequency of said first oscillatory signal and said second oscillatory signal to coincide with the frequency of a reference periodic signal.

* * * * *